United States Patent
Dawson et al.

[11] Patent Number: 5,850,105
[45] Date of Patent: Dec. 15, 1998

[54] SUBSTANTIALLY PLANAR SEMICONDUCTOR TOPOGRAPHY USING DIELECTRICS AND CHEMICAL MECHANICAL POLISH

[75] Inventors: Robert Dawson, Austin; Mark W. Michael, Cedar Park; Basab Bandyopadhyay, Austin; H. Jim Fulford, Jr., Austin; Fred N. Hause, Austin; William S. Brennan, Austin, all of Tex.

[73] Assignee: Advanced Micro Devices, Inc.

[21] Appl. No.: 822,120

[22] Filed: Mar. 21, 1997

[51] Int. Cl.⁶ ..................................... H01L 23/58
[52] U.S. Cl. .................. 257/758; 257/296; 257/759; 257/760; 438/624; 438/631; 438/699; 438/697; 438/763
[58] Field of Search ..................... 257/758, 759, 257/760, 296; 438/624, 631, 699, 697, 763

[56] References Cited

U.S. PATENT DOCUMENTS

| 5,508,233 | 4/1996 | Yost et al. | 438/624 |
| 5,523,615 | 6/1996 | Cho et al. | 257/759 |
| 5,671,175 | 9/1997 | Liu et al. | 257/296 |

*Primary Examiner*—Steven H. Loke
*Assistant Examiner*—Fetsum Abraham
*Attorney, Agent, or Firm*—Kevin L. Daffer; Conley, Rose & Tayon

[57] ABSTRACT

A method for forming a multilevel interconnect structure having a globally planarized upper surface. Dielectrics are deposited upon a semiconductor to minimize pre-existing disparities in topographical height and to create an upper surface topography having a polish rate greater than that of lower regions. Subsequent chemical mechanical polishing produces a substantially planar surface.

10 Claims, 3 Drawing Sheets

SUBSTANTIALLY PLANAR SEMICONDUCTOR TOPOGRAPHY USING DIELECTRICS AND CHEMICAL MECHANICAL POLISH

BACKGROUND OF THE INVENTION

1. Field of the Invention

This invention relates to semiconductor fabrication and ore particularly to an integrated circuit which employs a multilevel interconnect structure. The multilevel interconnect structure includes at least two layers of interconnect spaced from each other by an interlevel dielectric structure. The dielectric structure contains a combination of dielectric layers upon which the upper layer surface can be readily planarized to a substantially uniform level over regions of both densely spaced and sparsely spaced interconnect.

2. Description of the Relevant Art

The density of active devices placed upon a single monolithic substrate has steadily increased over the years. As the minimum feature size on an integrated circuit decreases, the active device density increases. As a result, the density of overlying interconnect must also be increased. With limited area, interconnect density is often forced to dimensionally expand above the substrate in a multilevel arrangement. Accordingly, multilevel interconnect structures have become a mainstay in modern integrated circuit manufacture.

Loss of topographical planarity occurs from the numerous levels of a multilevel interconnect structure. Non-planarity causes many problems which impact manufacturing yield. Exemplary problems include stringers arising from incomplete etching over severe steps, failure to open vias due to interlevel dielectric thickness disparity, step coverage problems, and depth-of-focus problems. Many manufacturers have undergone extensive work on methods for planarizing layers. Generally speaking, manufacturers have focused upon planarizing the dielectric layers (i.e., the interlevel dielectric surfaces on which subsequent conductive layers are placed). A planarized dielectric affords more accurate placement of overlying levels of conductors and dielectrics.

One of the more complex problems involved in manufacturing a reliable multilevel interconnect structure is the planarization of the interlevel dielectric layers formed on each level of interconnect. There are typically two types of interlevel dielectrics: a metal interlevel dielectric and a polysilicon interlevel dielectric. The metal interlevel dielectric is formed upon metal interconnect, either the first, second or subsequent layers of metal within the multilevel interconnected structure, and the polysilicon interlevel dielectric is formed upon only polysilicon interconnect, generally the first level of interconnect. Accordingly, a multilevel interconnect structure herein is defined as one incorporating polysilicon interlevel dielectric and one or more metal interlevel dielectrics.

Planarization of an interlevel dielectric, whether metal or polysilicon, is a matter of degree. There are several types of planarization techniques ranging from minimal planarization (i.e., smoothing); intermediate planarization, involving only isolated or local planarization; and extensive planarization, involving global planarization. Smoothing entails merely lessening the step slopes at the dielectric surface while not significantly reducing the disparities in surface elevation. On the other hand, local planarization substantially reduces if not eliminates entirely the disparities in elevation in localized areas across the substrate. Global planarization, however, is designed to eliminate disparities in elevation over the entire topography of the integrated circuit. As one can imagine, global planarization is extremely difficult to achieve on a multilevel interconnect structure having, for example, two or more levels of metal and/or polysilicon interconnect.

Most manufacturers have quantified the level of planarization, and have attributed a planarization factor generally described as total indicated range or ("TIR"). If the planarization factor or TIR is large, then subsequent interconnect placed on the interlevel dielectric surface may suffer from numerous problems such as those described above. Even though local planarization is achieved, absent global planarization, many of these problems remain, especially at the junction between the local/global planarization areas. For example, if a sub-micron interconnect feature is to be patterned, the TIR must be less than approximately 0.5 microns. Absent global planarization, such sub-micron features cannot be readily obtained.

In order to attempt global planarization, conventional planarization processes involved many separate types of planarization. Limited planarization is achieved through a sacrificial etchback technique. Sacrificial etchback involves depositing a sacrificial layer across the interlevel dielectric topography, and then removing a sacrificial layer at the same etch rate as the underlying dielectric. The sacrificial etchback technique is well documented, and is generally valid only for the planarization of dielectric topographies in which the underlying features are 2.0 to 10.0 microns apart. For large regions between trenches, the step height will not be reduced, since the thickness of the sacrificial material on top of such features will be the same as the thickness over the adjacent trench. Another planarization technique involves deposition of a planarization layer, followed by etchback, followed by another deposition. Thus, an oxide can be deposited and etched, and then additional oxide can be placed in a deposit-etch-deposit sequence, all of which can be repeated as necessary. One problem involving deposit-etch-deposit is the very low throughput involved in depositing, etching and then re-depositing within, e.g., a CVD/etch tool.

A more recent planarization process called chemical-mechanical polishing ("CMP"), overcomes to some extent the limitations of sacrificial etchback and block masking. CMP involves application of a slurry and abrasive pad across the entire topography. CMP forces planarization of that topography commensurate with the planarity of the pad surface. Provided the pad surface is relatively flat, the surface would be translated to the interlevel dielectric surface. Unfortunately, however, when force is applied to the pad, the pad will conform or flex to the unevenness of the topography on which it is applied. Thus, while high elevational areas (or peaks) receives substantial polishing, low elevational areas (or valleys) are also slightly abraded and removed.

Planarization can become quite difficult in regions in which there are relatively large distances between devices on the semiconductor surface (sparse regions). Conductors separated by a relatively large distance present an especially difficult problem for planarization because the large spacing contributes to a disparity in height along the surface topography. Such a disparity contributes to greater flexing of a CMP pad; this greater flexing decreases the amount of planarization possible because the topography of the surface being polished mimics the orientation and topography of the pad itself.

It is desirable to formulate a planarization technique which can achieve substantial global planarization of the entire upper surface of an interlevel dielectric. Global planarization, presented as small TIR, may be achieved through CMP but with a preconditioning of the surface upon which the polishing pad is placed. If the surface, in its initial state, is relatively smooth and planar, then the CMP pad will not flex to a substantial degree. Such minimizing of flexing aids in the degree of planarization achieved. If the topography of the underlying surface mimics the topography and orientation of the pad, minimum flexing of the pad corresponds to a minimum disparity in elevation of the underlying interlevel dielectric surface. Minimizing disparities in elevation and thus minimizing the flexure of the CMP pad is thereby a desired outcome of a to-be-planarized interlevel dielectric surface. If a surface can maintain these properties, the CMP will be more effective as a planarization tool.

It would be desirable to derive a planarizing layer, layers, or structures which could be deposited upon a layer of interconnect to aid in the achievement of global planarization. The planarizing layer, layers, or structures must be formed such that the end result is a substantially smooth surface. If the topography of the layer of interconnect has large disparities in elevation, it would be desirable to minimize such disparities first by forming a structure upon the topography, the purpose of which would be to minimize any preexisting disparities in elevation (and thus aid in minimization of the flexing of the CMP pad). Upon such a structure, it would then be desirable to form a planarizing layer which would further aid in achieving global planarization through the application of CMP to that topography.

It would be desirable, in the alternative, to derive a planarizing surface by first forming structures upon the topography of the layer of interconnect, the purpose of which would be to minimize preexisting topographical disparities in height, followed by forming a surface upon the topography which has localized regions of high density and low density materials. Such a structure and surface will minimize the flexing of the CMP pad and thereby lead to a highly planar surface. The high density materials are relatively hard and would not respond well to CMP. Conversely, lower density materials polish readily when abraded with a polishing pad.

It would thereby be desirable to formulate an interlevel dielectric surface having a variable polish rate depending upon whether the surface is elevated or recessed. In elevated areas, it would be desirable to remove the surface at a higher polish rate than in recessed areas. Deriving such a surface would thereby prove beneficial in optimizing the results which are achieved through CMP. The combination of this preconditioned surface and subsequently applied CMP causes an interlevel dielectric surface which is substantially planarized in a global manner with relatively small TIR and the advantages thereof. Any subsequently placed level of interconnect will thereby be accurately depicted upon the interlevel dielectric structure to produce an improved multilevel interconnect structure.

SUMMARY OF THE INVENTION

The problems outlined above are in large part solved by an improved multilevel interconnect structure. The interconnect structure is one having globally planarized metal or polysilicon interlevel dielectric. Accordingly, such interlevel dielectric is planarized in readiness for a subsequent interconnect level.

Planarization is achieved by first forming a dielectric structure solely between conductors which are spaced relatively far apart. The spacing between this dielectric and its neighboring conductors is comparable to the distance between individual conductors which are placed relatively close together. Placing a structure (i.e., a dielectric) between largely-spaced conductors decreases the disparity in height which was discussed above in relation to sparse regions of the semiconductor surface.

The dielectric structure is formed by blanket-depositing a layer of dielectric material on top of the semiconductor topography by suitable means such as chemical vapor deposition. This blanket layer is then selectively removed (using standard lithography and masking techniques) so that dielectric material remains between conductors, which are spaced relatively far apart, and metal spacers.

A second dielectric is then placed upon and between the conductors and the patterned dielectric structures within a given level of interconnect. The second dielectric is formed such that as the second dielectric material is deposited, that material is also somewhat removed but at a lesser rate than the accumulation rate. Accumulation occurs along with sputtering. The deposited second dielectric is sputter-etched by biasing the semiconductor substrate itself. The biased value is relative to positive ions being bombarded upon the substrate surface. The value of the negative bias can be controlled to affect the accumulation (or deposition) rate, principally by affecting the removal (etch) rate. The second dielectric forms elevationally raised areas which accumulate in peaks near the midline above each conductor and each dielectric structure.

In one embodiment of the invention, the elevationally raised regions are readily removed by a subsequently placed CMP polish pad. The CMP polishing process, because of factors including greater surface contact and pressure with the elevationally raised regions, removes material from the raised regions at a faster rate than material from lower regions. Thus, after a sufficiently long period, the difference in height between the elevationally raised and lowered regions becomes smaller, until a finalized surface topography having a substantially global planar surface is achieved.

In another embodiment of the invention, before any polishing steps, an additional dielectric may be spin-on deposited in liquid form upon valleys between the peaks such that it is retained primarily at levels below the peaks of the second dielectric. Heating of this dielectric is carried forth for a time duration necessary to harden the spin-on material. The amount of hardening allows the spin-on material to be somewhat resistant to abrasion. If the cure cycle is significant, the spin-on material is not easily removed by CMP in relation to the second dielectric. Accordingly, the densified or hardened dielectric occupies lower regions and the less-polish-resistant, second dielectric occupies raised regions. The raised regions, partially due to their lesser hardness and partially due to their "peaked" configuration, are readily removed by a subsequently placed CMP polish pad. The polish pad, even under flexure, does not attack the lower regions due to the hardened material which resides in those regions. Accordingly, over a sufficiently long period, the CMP process can remove the elevationally high regions at a faster rate than the low regions, causing a finalized surface topography having a substantially global planar surface. The remaining surface is substantially even and commensurate with the polish resistant dielectric upper surface found within the lower areas of the second dielectric (i.e., between peaks of the second dielectric).

BRIEF DESCRIPTION OF THE DRAWINGS

Other objects and advantages of the invention will become apparent upon reading the following detailed description and upon reference to the accompanying drawings in which.

Figure 1:
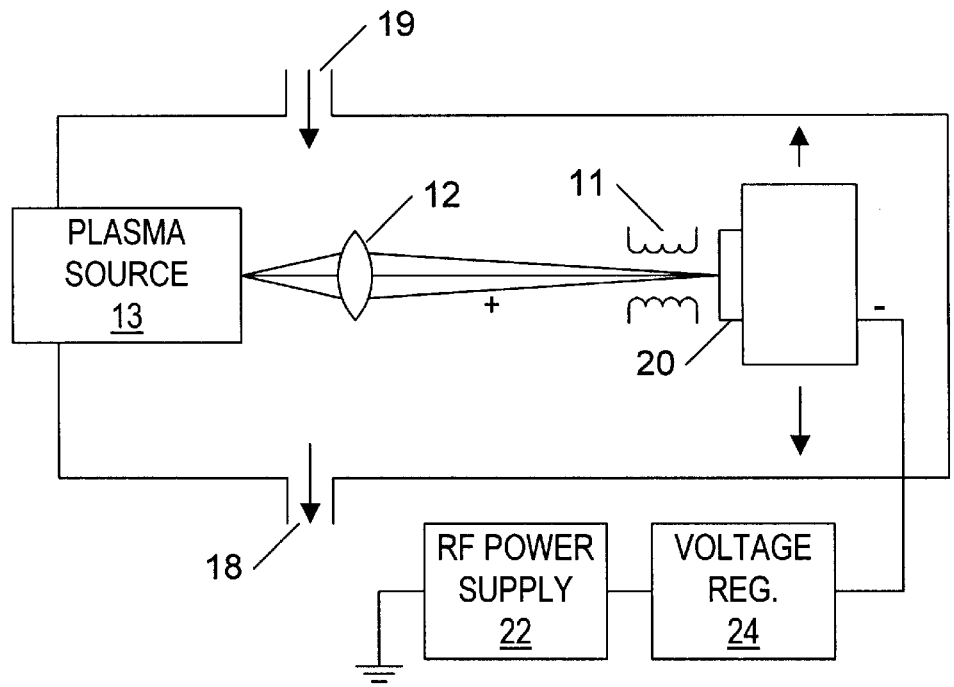
FIG. 1 is a schematic view of a chamber configured to bias deposit a dielectric film upon a semiconductor topography according to an exemplary embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to FIG. 1, a schematic view of a sputter deposition chamber 10 is shown. Chamber 10 is maintained in a vacuum through evacuation port 18. Gas inlets 19 inject appropriate species such as $SiH_4+O_2$ into chamber 10 to form an appropriate deposition chemistry. Chamber 10 includes a concentrator 12 which focuses plasma 14 emanating from plasma source 13. A concentrator coil 12 or magnetic field may be used to confine plasma 14 contained in chamber 10. Plasma 14 is charged to a positive voltage and accelerated toward the surface of a wafer 20 which is in close proximity to heater/temperature controller 11. Plasma 14 can comprise an inert species such as argon (Ar). Positive ions from the plasma are directed to a wafer 20 where they impinge on the surface while simultaneously dislodging (sputtering) molecules from the accumulated material on the surface.

Ions used for sputtering are generally positive, and wafer substrate 20 is negatively biased. This negative bias can be done directly by a DC power supply or accomplished by a charge build up on the target when it is fed by a capacitive-coupled RF voltage. Thus, an RF power supply 22 delivers a negative biased voltage to substrate 20. In the interim, however, part of power supply 22 is modulated by a voltage regulator 24. Voltage regulator 24 subjects negative RF bias of dissimilar amounts upon substrate 20. Application of a negative bias to the semiconductor topography serves two key purposes. First, a dielectric is caused to accumulate on the semiconductor topography which is relatively non-porous, and has a preferred dielectric strength as well as the ability to provide corrosion protection to underlying metal films. Second, ion bombardment on the semiconductor topography as well as the target causes the dielectric film grown on the topography to take on a beneficial microstructure that is dense and with properties similar to those of thermally grown $SiO_2$ ("oxide"). Application of a bias to the semiconductor topography can to some extent cause that topography to planarize as it is grown. Further details regarding the dielectric formed in accordance with chamber 10 is described below in reference to a CVD-sputtered dielectric. The CVD-sputtered dielectric takes on a geometric constraint that produces a beneficial surface upon which planarization may be more readily achieved.

Figure 2:
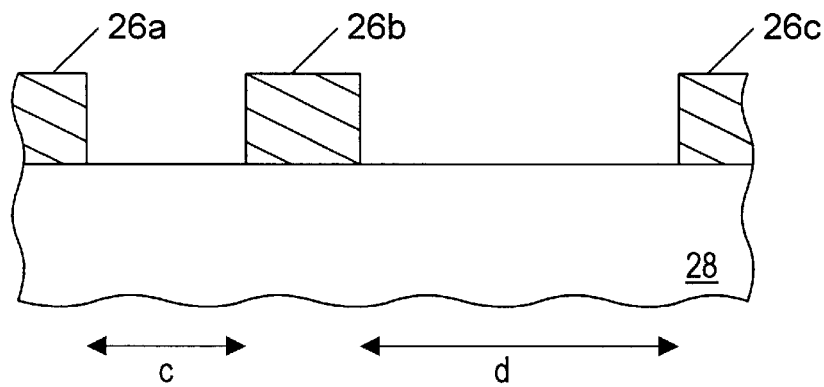
FIG. 2 is a partial cross-sectional view of a layer of interconnect formed upon a semiconductor topography according to an exemplary embodiment of the present invention.

Turning now to FIG. 2, a partial cross-sectional view of a layer of interconnect 26 is shown. Interconnect 26 comprises a substantially coplanar plurality of conductors spaced from each other across the semiconductor topography 28. Semiconductor topography 28 includes a silicon substrate covered by a dielectric, or a layer of interconnect covered by dielectric. Interconnect 26 includes conductors which are unevenly spaced from each other. FIG. 2 presents three conductors 26a, 26b and 26c. The spacing c between conductors 26a and 26b is less than the spacing d between conductors 26b and 26c. This disparity in spacing generally causes planarization problems for subsequently deposited dielectrics as discussed earlier in this specification.

Figure 3:
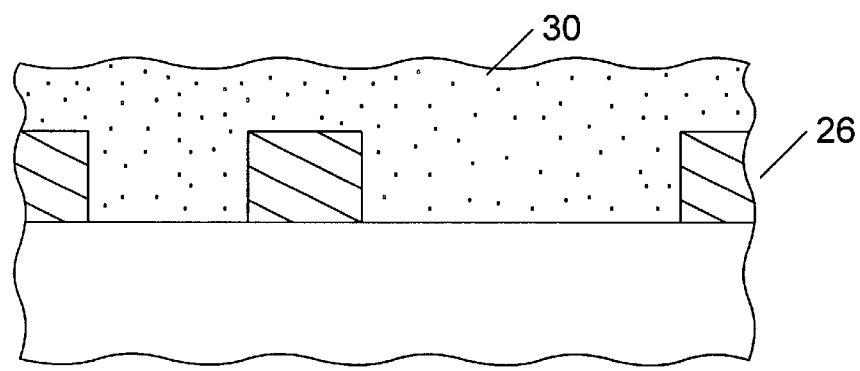
FIG. 3 is a cross-sectional view of a processing step subsequent to that of FIG. 2, wherein a dielectric is deposited upon and between the interconnect according to an exemplary embodiment of the present invention.

FIG. 3 illustrates a processing step subsequent to FIG. 2, wherein a dielectric 30 is deposited upon and between interconnect 26. Dielectric 30 may be formed by any one of numerous standard techniques, well known in the art, such as chemical vapor deposition.

Figure 4:
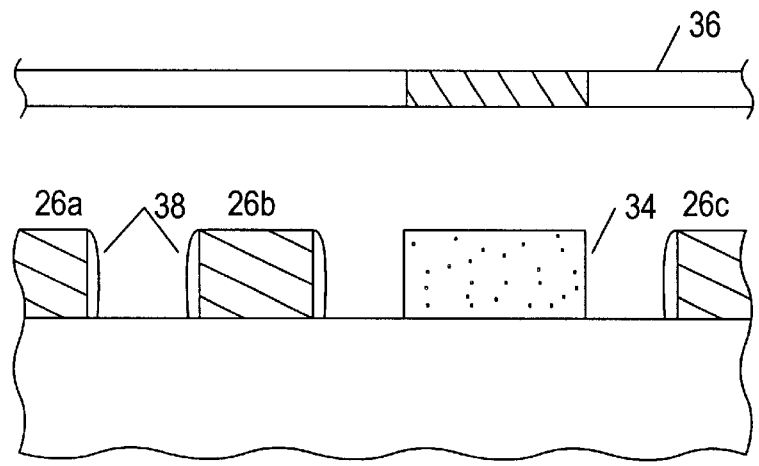
FIG. 4 is a cross-sectional view of a processing step subsequent to that shown in FIG. 3, wherein the dielectric deposited in FIG. 3 is selectively removed to form a dielectric structure in a region between interconnect conductors and metal spacers.

FIG. 4 illustrates a processing step subsequent to FIG. 3, wherein portions of dielectric 30 are selectively removed using standard techniques (e.g. by using a mask 36 followed by etchback) well known in the art so that a dielectric structure 34 remains in a sparse region of interconnect 26, here, between conductors 26b and 26c. Sidewall spacers 38 on the sidewalls of the conductors are shown. As defined herein, a sparse region is one having a spacing between conductors which exceeds the spacing of a dense region. In some instances, the dense region may represent the minimum spacing rule for a given integrated circuit layout. For example, if the minimum spacing between conductors is 2.0 microns, then the sparse region would have a spacing greater than 2.0 microns. The dense region, however, would have a spacing approximately equal to 2.0 microns. Dielectric structure 34 is spaced a first distance from conductor 26b and a second distance from conductor 26c. The first and second distances may be equal and commensurate with the spacing of a dense region (e.g., the first and second distances may equal the spacing between conductors 26a and 26b). With dielectric structure 34 separated from surrounding conductors by the spacing of a dense region, pre-existing disparities in elevation may be minimized, aiding in the planarization process.

Figure 5:
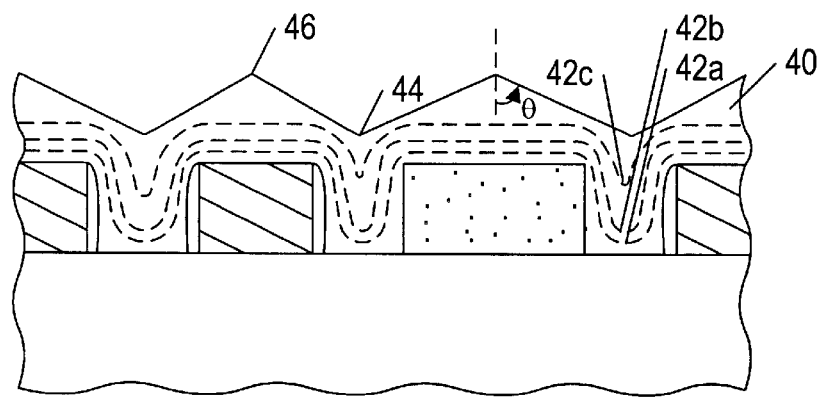
FIG. 5 is a cross-sectional view of a processing step subsequent to that shown in FIG. 4, wherein a CVD-sputtered dielectric formed from the chamber of FIG. 1 is deposited upon and between the interconnect according to an exemplary embodiment of the present invention.

FIG. 5 illustrates CVD-sputtered dielectric 40 deposited upon and between interconnect 26. CVD-sputtered dielectric 40 is formed in accordance with the sputter chamber configured as shown in FIG. 1. More specifically, a dielectric film is deposited in stages. Deposition is carried forth at the same time in which ions bombard the film during its growth (i.e., as a result of negative bias upon the wafer). Ion bombardment or resputtering causes, to some degree, planarization of the growing surface in situ. Resputtering in the surface is a strong function of the geometry of the interconnect upon which the CVD-sputtered dielectric is formed. The net deposition on sloped areas of metal interconnect 26 is much lower than it is on flat areas. Contour lines 42a, 42b, and 42c illustrate this differential. Dielectric 40 thus exhibits an upper surface with topographically raised regions interspersed with topographically lower regions. Successive deposition of layer upon layer and resputtering of those layers causes a pyramid structure to form, wherein the peak of each pyramid is above a midline of interconnect 26. The pyramid structure is not only the result of flat surface growth greater than sidewall surface growth, but also is the result of resputtering (or removing) the sharp corners away from the material as it is grown. What is left is a surface which extends from a lower area 44 to an upper area 46; the upper area is referred to as the peak of the pyramid structure. Extension of the upper surface from the lower surface occurs along an acute angle θ.

If CVD sputtering is contained for a sufficiently long period of time, the pyramid peaks will be removed but only after a significant thickness of deposited material is placed over interconnect 26. The time it takes to produce such a thickness is, in most cases, impractical.

Figure 6:
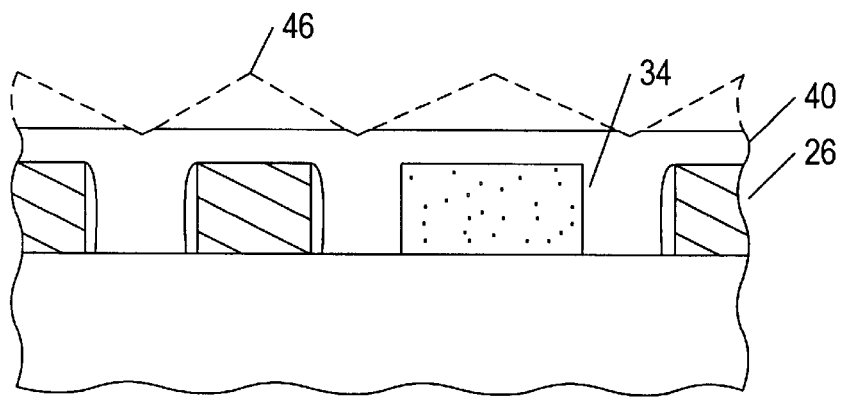
FIG. 6 is a cross-sectional view of a processing step subsequent to that shown in FIG. 5, wherein CMP is utilized to remove material in the elevated regions to form an interlevel dielectric structure having a substantially planar upper surface.

FIG. 6 illustrates a processing step subsequent to FIG. 5, wherein a CMP is applied under the aforesaid conditions to readily remove the upper surfaces of dielectric 40 to an elevational level commensurate with the elevation of the lower regions of dielectric 40. The removed regions of dielectric 40 are shown in dashed line, and generally comprise the pyramid structures 46 above interconnect 26. Because of the presence of dielectric 34 within the once-sparse region of the semiconductor topography, polishing pad flexure does not substantially hinder the planarization process. Accordingly, the lower elevational regions in large valley areas are retained. Further planarization may be needed to provide a more global level of planarization.

Figure 7:
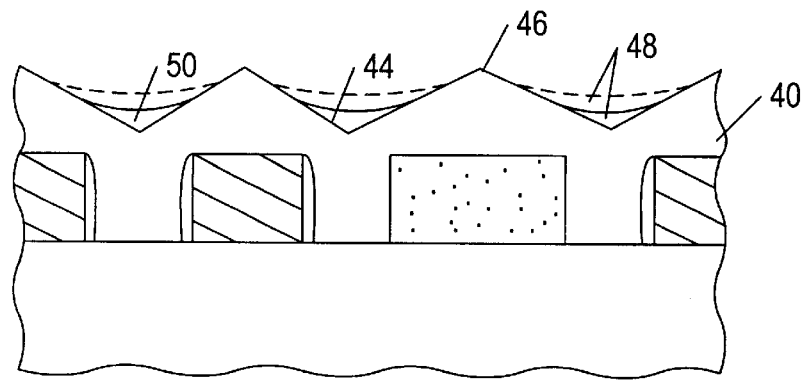
FIG. 7 is a cross-sectional view of a processing step in an alternative embodiment subsequent to the step shown in FIG. 5, wherein a densified layer of dielectric is deposited in lower regions of the CVD-sputtered dielectric according to a preferred embodiment of the present invention.

FIG. 7 illustrates a processing step in an alternative embodiment of the present invention following the step shown in FIG. 5. FIG. 7 illustrates deposition of a dielectric-bearing material 48 upon select portions of CVD-sputtered dielectric 40. Specifically, material 48 is placed in liquid form through spin-on deposition techniques such that the liquid material settles in lower elevational regions 44 of dielectric 40. A majority of material 48 thereby extends between peaks 46, i.e., between densely spaced and closely spaced interconnects 26. Material 48 comprises silicates, siloxanes, polyimides, silsesquioxanes, or any other material which can be spin-on deposited and thereafter demonstrate dielectric function after it is cured.

Curing of material 48 is shown in reference to indicia 50. Curing occurs through application of a temperature exceeding 250° C., for a time period sufficient to densify material 48. The densified material demonstrates a polish resistant characteristic, and is denoted as reference numeral 50.

Material 50 is generally regarded as a variable density material. It begins as a low density material and, as a result of heat applied thereto, densifies. Densification changes both the chemical and mechanical properties of the material. Once densified, the material is generally less susceptible than dielectric 40 to the slurry polishing compounds used in CMP. Without being bound to theory, it is believed that the slurry particles do not "cut" or micro-scratch the upper surface of material 50 as easily as material 40. Absent an initial mechanical abrasion, there is less of an environment present for high chemical activity. The chemical-mechanical polish generally comprises an alkali silica slurry and a polishing pad pressure in the range of 2–20 lbs./in$^2$.

Figure 8:
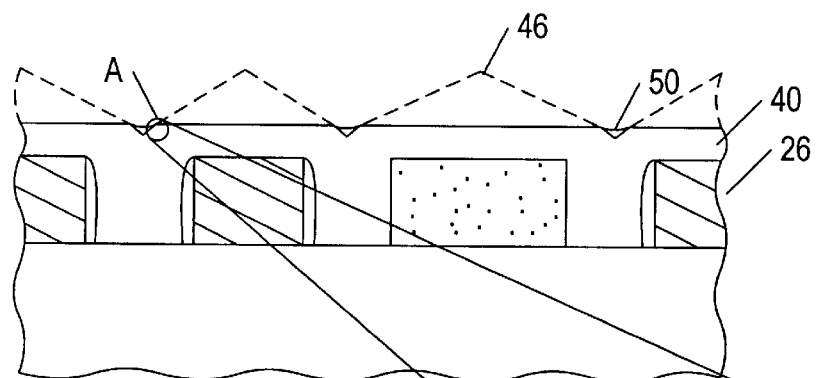
FIG. 8 is a cross-sectional view of a processing step subsequent to that shown in FIG. 7, wherein upper portions of the densified dielectric and CVD-sputtered dielectric are removed during an initial chemical mechanical polish (CMP) step according to a preferred embodiment of the present invention.

FIG. 8 illustrates application of CMP under the aforesaid conditions to readily remove the upper surfaces of dielectric 40 to an elevational level commensurate with the upper surface at which polish resist material 50 exists. The removed regions of dielectric 40 are shown in dashed line, and generally comprise the pyramid structures 46 above interconnect 26. Because material 50 is resistant to polish, even polishing pad flexure does not substantially remove material 50 in regions above spacings between interconnect 26. Accordingly, the lower elevational regions in large valley areas are retained. A further planarization may be needed, however, to provide global planarization.

Figure 9:
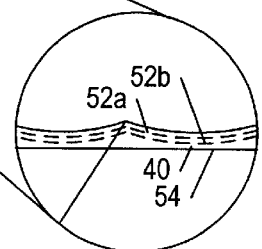
FIG. 9 is a detailed view along plane A of FIG. 8, showing a contour of layers removed in succession to form a planar upper surface in accordance with CMP in the region disclosed.
Figure 10:
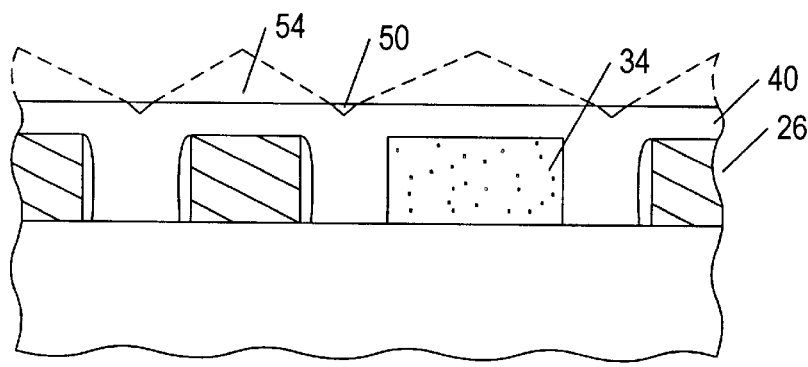
FIG. 10 is a cross-sectional view of a processing step subsequent to that shown in FIG. 9, wherein CMP is completed to form an interlevel dielectric structure having a substantially planar upper surface.

FIG. 9 illustrates subsequent applications of CMP as detailed along area A of FIG. 5. Contours 52a and 52b indicate successive removal of dielectric 40 relative to dielectric 50. Removal of the dielectrics in region A occurs according to contour 52a, then 52b, etc. until a substantially planar surface 54 is achieved. CMP naturally removes isolated upper protrusions more so than valley areas, and thereby will remove the upward juncture between dielectrics 40 and 50 quite easily. CMP will also remove the higher elevational regions of dielectric 40 to bring them in alignment with that of dielectric 50. The overall planarization surface 54, formed after CMP, is presented in FIG. 10. Surface 54 extends across the entire wafer surface, having localized regions of dielectric 50 and dielectric 40. The dielectrics 50 exist in regions between interconnect 26, and regions of dielectric 40 are formed above interconnect 26 and structure 34.

It will be appreciated to those skilled in the art having the benefit of this disclosure that this invention is believed to be capable of applications with MOS-processed circuits, and specifically with circuits having a multilevel interconnect structure. The substantially planar interlevel dielectric upper surface is produced between each level of interconnect to form a multilevel interconnect structure. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such variations and modifications.

What is claimed is:

1. An interlevel dielectric structure comprising:
   a spaced set of conductors arranged upon a semiconductor topography, comprising a first conductor spaced a first lateral distance from a second conductor and a third conductor spaced a second lateral distance from said second conductor, said second lateral distance being greater than said first lateral distance;

a first dielectric formed upon said semiconductor topography solely between said second and third conductors, wherein said first dielectric is spaced a primary lateral distance from said second conductor and a secondary lateral distance from said third conductor;

a second dielectric formed upon and between said first conductor and said second conductor, and upon and between said second conductor and said first dielectric, and upon and between said first dielectric and said third conductor, said second dielectric having an upper surface with elevationally raised regions interspersed with elevationally lowered regions; and a third dielectric formed intermittently upon only said elevationally lowered regions of said second dielectric.

2. The interlevel dielectric structure as recited in claim 1, wherein said first lateral distance substantially equals said primary or secondary lateral distance.

3. The interlevel dielectric structure as recited in claim 1, wherein said primary lateral distance substantially equals said secondary lateral distance.

4. The interlevel dielectric structure as recited in claim 1, wherein sidewall spacers extend upward substantially perpendicular to said semiconductor substrate, said spacers being located on the vertical sidewalls of said spaced set of conductors.

5. The interlevel dielectric structure as recited in claim 1, wherein said second dielectric comprises a CVD-sputtered dielectric.

6. The interlevel dielectric structure as recited in claim 1, wherein said elevationally raised regions of said second dielectric are centered above midline axes along which said first, second, and third conductors and said first dielectric extend.

7. The interlevel dielectric structure as recited in claim 1, wherein said third dielectric regions comprise a densified dielectric.

8. The interlevel dielectric as recited in claim 7, wherein said densified dielectric comprises a material selected from the group consisting of silicates, siloxanes, polyimides, and silsesquioxanes.

9. The interlevel dielectric structure as recited in claim 7, wherein said densified dielectric has a resistance to chemical-mechanical polishing greater than the resistance of said second dielectric to chemical-mechanical polishing.

10. The interlevel dielectric structure as recited in claim 7, wherein upper surfaces of said elevationally raised regions of the second dielectric are substantially coplanar with upper surfaces of said third dielectric regions.

* * * * *